United States Patent
Kuriyama et al.

(10) Patent No.: US 7,695,599 B2
(45) Date of Patent: Apr. 13, 2010

(54) DISCHARGING POWER SOURCE, SPUTTERING POWER SOURCE, AND SPUTTERING DEVICE

(75) Inventors: Noboru Kuriyama, Kanagawa (JP); Kazuhiko Imagawa, Kanagawa (JP)

(73) Assignee: Shibaura Mechatronics Corporation, Yokohama-shi (JP)

( * ) Notice: Subject to any disclaimer, the term of this patent is extended or adjusted under 35 U.S.C. 154(b) by 1333 days.

(21) Appl. No.: 10/514,561

(22) PCT Filed: May 30, 2003

(86) PCT No.: PCT/JP03/06821

§ 371 (c)(1),
(2), (4) Date: Nov. 30, 2004

(87) PCT Pub. No.: WO03/103348

PCT Pub. Date: Dec. 11, 2003

(65) Prior Publication Data

US 2006/0011473 A1    Jan. 19, 2006

(30) Foreign Application Priority Data

May 31, 2002   (JP) ............................... 2002-160455

(51) Int. Cl.
*C23C 14/00*     (2006.01)
*C25B 11/00*     (2006.01)
*C25B 13/00*     (2006.01)
(52) U.S. Cl. .............................. 204/298.41; 204/298.01
(58) Field of Classification Search ............ 204/298.03, 204/298.08, 298.01, 298.41
See application file for complete search history.

(56) References Cited

U.S. PATENT DOCUMENTS 6,069,335 A * 5/2000 Kinbara .................... 219/69.13
6,416,638 B1 * 7/2002 Kuriyama et al. ...... 204/298.08

FOREIGN PATENT DOCUMENTS

| JP | 55-145170 | 11/1980 |
| JP | 61-030665 | 2/1986 |
| JP | 63-190168 | 8/1988 |
| JP | 2-194831 | 8/1990 |
| JP | 8-277468 | 10/1996 |
| JP | 10-046324 | 2/1998 |
| JP | 10-298754 | 11/1998 |
| JP | 10-298755 | 11/1998 |
| JP | 11-504988 | 5/1999 |

* cited by examiner

*Primary Examiner*—Jennifer K Michener
*Assistant Examiner*—Michael Band
(74) *Attorney, Agent, or Firm*—Oblon, Spivak, McClelland, Maier & Neustadt, L.L.P.

(57) ABSTRACT

A discharging power supply including a direct current power supply unit, a control unit for controlling an output of the direct current power supply unit, and a vibrating current generation unit having a capacitance connected in parallel with a pair of outputs from the direct current power supply unit and an inductance connected to at least one of the pair of outputs, wherein the control unit controls the direct current power supply unit so that current outputted from the direct current power supply unit does not exceed a limit current value in at least a portion of a range of voltage that can be outputted from the direct current power supply unit. Thus, regardless of whether the discharge power is set to be high or low, discharge current exceeding the limit characteristic line can be prevented from flowing.

7 Claims, 10 Drawing Sheets

DISCHARGING POWER SOURCE, SPUTTERING POWER SOURCE, AND SPUTTERING DEVICE

TECHNICAL FIELD

The invention relates to a discharging power supply, sputtering power supply, and sputtering apparatus, and more particularly, to a discharging power supply and sputtering power supply having the capability of stable plasma discharge or glow discharge that can apply DC (direct current) voltage while preventing occurrence of arc discharge, and a sputtering apparatus using the same.

BACKGROUND ART

In various plasma application equipment, glow discharge application equipment and the like, occurrence of arc discharge during discharging often causes problems in the operation of the equipment. For this reason, a discharging power supply is often required that can definitely and quickly break arc discharge. In the following, as a specific example, a sputtering apparatus for use in forming thin film will be described.

FIG. 11 is a schematic diagram showing the structure of a relevant part of a DC sputtering apparatus. This sputtering apparatus comprises a vacuum chamber 101 and a sputtering DC power supply 110. The anode of the power supply 110 is connected via a connecting cable 120A to the chamber 101, and placed at ground potential. On the other hand, the cathode of the power supply 110 is connected via a connecting cable 120B to a sputtering target 104 provided inside the chamber 101. A substrate 100 on which thin film is to be deposited is placed inside the chamber 101.

In forming film, first, the inside of the chamber 101 is evacuated by a vacuum evacuation pump 106, and discharge gas such as argon (Ar) is introduced from a gas supply source 107 to maintain the inside of the chamber at a predetermined discharge pressure. Next, the power supply 110 applies an electric field between the target 104 and the chamber 101 to generate glow discharge 108. Then positive ions in plasma generated in the discharge space impinge on the surface of the target 104 to sputter atoms of the target 104. Such a sputter phenomenon can be used to form thin film made of the material of the target 104 on the substrate 100.

Such a sputtering apparatus is widely used in the process of forming thin film for various products including semiconductor devices, CDs (Compact Discs), DVDs (Digital Versatile Discs), and liquid crystal display devices.

However, arc discharge 150 may occur during such a sputter operation. Such arc discharge 150 occurs more often in the vicinity of the target 104. When such arc discharge 150 occurs, a large current locally flows, which damages the target 104 or the substrate 100.

For example, when arc discharge 150 occurs on the side of the target 104, a large current concentrates on a small region of the target 104, which causes a large amount of deposition material to emit instantaneously from the region. This phenomenon is referred to as "splash", which splashes particles of deposition material on the surface of the substrate 100, thus causing damage.

It is therefore required to provide arc suppressing means in the power supply 110 in order to prevent damage due to such arc discharge.

Methods of suppressing arc discharge in DC sputtering may include the following:

(1) Arc discharge is suppressed by periodically turning off the power supply output to provide a resting period.

(2) Arc discharge is quenched by inverting the current using the switching action of arc discharge and the oscillation of LC provided in the output circuit of the power supply.

(3) Arc discharge is detected, and the arc current is turned off by a switch element. In this case, the switch element may be inserted in series or parallel with the load to turn off the arc current.

(4) Arc discharge is detected, and then it is quenched by activating a switch element to apply reverse voltage.

(5) Arc discharge is suppressed by periodically activating a switch element to apply reverse voltage.

Among them, the inventors disclosed the methods that use a switch element in Japanese Patent Nos. 2835322 and 2835323.

On the other hand, the above method (1) has a problem of decreasing throughput because sputtering is interrupted.

In contrast, the above method (2) has the potential to simplify the apparatus configuration in that arc discharge can be suppressed without using switch elements and the like. More specifically, if an LC resonant circuit is provided at the output end of the DC power supply, and when arc discharge occurs, its switching action can be used to generate vibrating current. When this vibrating current has crossed 0 A (zero ampere) to change its polarity, the current can be turned off by the rectifying action of arc discharge (current does not flow under the reverse voltage because thermoelectrons are emitted only from the hot spot), thereby quenching arc.

However, after independent investigation, the inventors have found that such a discharging power supply having arc quenching mechanism with vibrating current has room for improvement with respect to its operation.

More specifically, the operation control for such a DC power supply using an LC resonant circuit may be performed so that a constant power control operation, a rated current limit operation, and a rated voltage limit operation are combined to prefer one of the signals that minimizes the output.

In other words, in such operation control, for a low sputter voltage, the flowing current is controlled to have the smaller of a value corresponding to the constant power control operation and a value limited by the rated current limit operation.

In contrast, in order to quench arc in the vibration mechanism, the amplitude of vibrating current that is generated at the transition from sputter voltage to arc voltage and that depends on LC circuit constants must exceed the sputter current to generate current vibration that crosses 0 A.

Two methods for generating such a large current vibration can be mentioned.

The first of the methods is to use LC constants for which a large current amplitude can be obtained corresponding to the rated current limit operation even for a low sputter voltage (e.g., 200 V).

The second is to set LC constants so that current amplitude corresponding to the rated current limit can be obtained at a lower value in the range of normal sputter voltage (e.g., 400 V), and below this sputter voltage, to variably control the power rating so that the upper limit of current is decreased corresponding to the voltage.

However, when the first method is used, an excessively large current vibration occurs during operation at normal sputter voltage (e.g., 600 V). As a result, large stress may be imposed on electric parts used in the power supply and/or noise may occur.

For this reason, the LC constants must be determined to correspond to a lower sputter voltage, and thus the second method described above must be used. For example, the discharge voltage may significantly decrease immediately after the target 104 is attached or after the chamber 101 is opened to the atmosphere because the surface of the target 104 is covered with oxides and the like. For this reason, the sputter power must be set to be sufficiently low. Thus, sputtering is performed initially in a sufficiently low power setting, which is referred to as "target cleaning mode". Then, as oxides are removed from the surface of the target 104 and the discharge voltage increases, the power setting is raised to transfer to normal sputter voltage.

However, this method has a problem that it involves cumbersome operations because the power setting is adjusted according to the sputter voltage.

The invention has been made on the basis of recognition of these problems. An object of the invention is to provide a discharging power supply and sputtering power supply being capable of quickly and definitely quenching arc discharge, having simple structure and being easy to operate, and a sputtering apparatus using the same.

DISCLOSURE OF THE INVENTION

In order to achieve the above object, a first discharging power supply of the invention comprises: a direct current power supply unit; a control unit for controlling an output of the direct current power supply unit; and a vibrating current generation unit having a capacitance connected in parallel with a pair of outputs from the direct current power supply unit and an inductance connected to at least one of the pair of outputs, wherein the discharging power supply outputs discharging power via the vibrating current generation unit, the control unit controls the direct current power supply unit so that current outputted from the direct current power supply unit does not exceed a limit current value in at least a portion of a range of voltage that can be outputted from the direct current power supply unit, and the limit current value has a positive correlation with the absolute value of the voltage in the at least a portion of the range of voltage.

According to the above configuration, regardless of whether the discharge power is set to be high or low, discharge current exceeding the limit characteristic line can be prevented from flowing. Even if arc discharge occurs, the amplitude of the vibrating current can be kept always larger than the discharge current. Thus the vibrating current definitely falls below zero ampere, and thereby arc can be definitely quenched.

Furthermore, a second discharging power supply of the invention comprises: a direct current power supply unit; a control unit for controlling an output of the direct current power supply unit; and a vibrating current generation unit having a capacitance connected in parallel with a pair of outputs from the direct current power supply unit and an inductance connected to at least one of the pair of outputs, wherein the discharging power supply outputs discharging power via the vibrating current generation unit, the control unit controls the direct current power supply unit so that current outputted from the direct current power supply unit does not exceed a limit current value in at least a portion of a range of voltage that can be outputted from the direct current power supply unit, and the limit current value is determined so that vibrating current generated by the vibrating current generation unit due to occurrence of arc discharge at the voltage has an amplitude 1.3 or more times as large as current for steady operation state at the voltage.

Also according to the above configuration, regardless of whether the discharge power is set to be high or low, discharge current exceeding the limit characteristic line can be prevented from flowing. Even if arc discharge occurs, the amplitude of the vibrating current can be kept always larger than the discharge current. Thus the vibrating current definitely falls below zero ampere, and thereby arc can be definitely quenched.

Here, in the first and second discharging power supplies, the limit current value may correspond to an upper limit current satisfying the equation:

$$I = (V - Va) \times (C/L)^{1/2} / K$$

where I is current outputted from the direct current power supply unit, V is voltage outputted from the direct current power supply unit, L is the inductance, C is the capacitance, Va is arc voltage, and K is a multiplicative factor of amplitude. Then the vibrating current definitely falls below zero ampere, and thereby arc can be definitely quenched.

The inductance may also include inductance of a connecting cable extending to a supply recipient that is supplied with the discharging power.

The power supply may further comprise voltage detection means for detecting voltage outputted via the vibrating current generation unit; and current detection means for detecting current outputted via the vibrating current generation unit, wherein the control unit performs feedback control based on a detection result by the voltage detection means and a detection result by the current detection means. Then reliable current control in response to the sputter voltage is facilitated.

The power supply may further comprise voltage detection means for detecting voltage outputted via the vibrating current generation unit; and current detection means for detecting current outputted via the vibrating current generation unit, wherein the control unit determines a set value of output current based on a detection result by the voltage detection means, a detection result by the current detection means, and a set value of output power, calculates the limit current value at the voltage in response to the detection result by the voltage detection means, controls the direct current power supply unit based on the set value of the output current when the set value of the output current is less than the limit current value, and controls the direct current power supply unit so that the limit current value is outputted when the set value of the output current is greater than the limit current value. Then the output current can be controlled in the range that does not exceed the limit current.

The control unit may use the limit current value to which an offset is not added when the detection result by the voltage detection means is higher than a first predetermined voltage and use the limit current value to which an offset is added when the detection result by the voltage detection means is lower than a second predetermined voltage. Then the output current can flow even when the output voltage is zero volt, and can be prevented from exceeding the limit characteristic line at high voltages.

The control unit may set the output of the direct current power supply unit to zero when the detection result by the voltage detection means is lower than a third predetermined voltage and the detection result by the current detection means is higher than a first predetermined current. Then arc discharge can be definitely broken.

The detection result by the voltage detection means may be determined via a low-pass filter. Then the number of vibrations (duration) of arc discharge before a gate pulse is blocked can be adjusted by appropriately determining constants of the low-pass filter.

A sputtering power supply of the invention, which forms thin film by sputtering a target, comprises any one of the above-described discharging power supplies, wherein a negative output of discharging power outputted via the vibrating current generation unit is connected to the target, thereby enabling the sputtering.

A sputtering apparatus of the invention comprises the above-described sputtering power supply; and a vacuum chamber capable of enclosing the target and maintaining an atmosphere with pressure reduced below the atmospheric pressure.

Also in the sputtering power supply and the sputtering apparatus, regardless of whether the sputter power is set to be high or low, sputter current exceeding the limit characteristic line can be prevented from flowing. Even if arc discharge occurs, the amplitude of the vibrating current can be kept always larger than the sputter current. Thus the vibrating current definitely falls below zero ampere, and thereby arc can be definitely quenched.

BEST MODE FOR CARRYING OUT THE INVENTION

The invention will be described in further detail with reference to the accompanying drawings.

Figure 1:
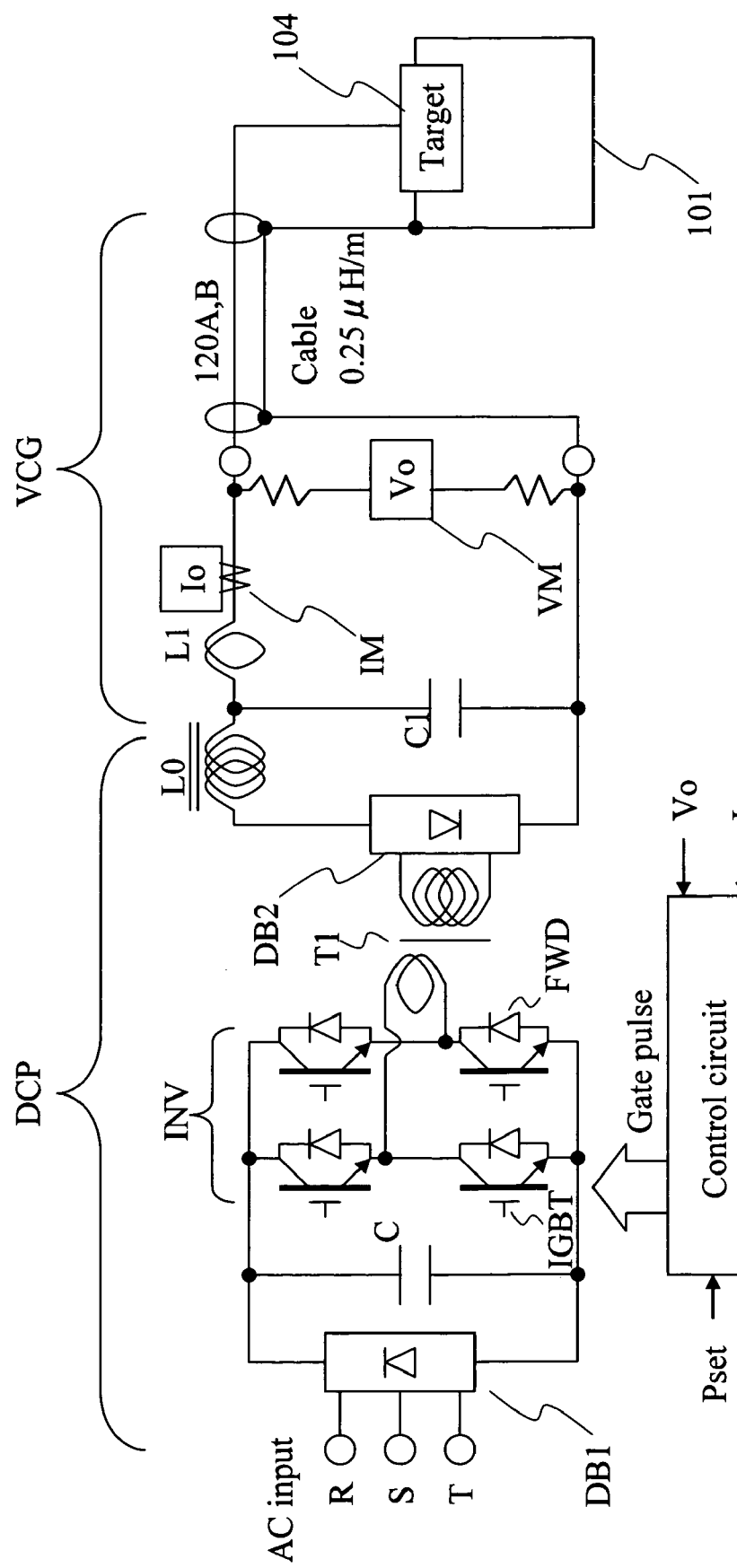
FIG. 1 is a schematic diagram showing a discharging power supply according to an embodiment of the invention and a sputtering apparatus using the same.

FIG. 1 is a schematic diagram showing a discharging power supply according to an embodiment of the invention and a sputtering apparatus using the same.

More specifically, the power supply illustrated in this figure comprises a DC power supply unit DCP and a vibrating current generation unit VCG.

The DC power supply unit DCP is a power supply for applying voltage between a chamber 101 as a positive electrode and a target 104 as a negative electrode to perform sputtering. The DC power supply unit DCP comprises, for example, as illustrated in FIG. 1, a rectifying diode bank DB1 that receives three-phase alternating current inputs of R, S, and T, an inverter INV composed of switching transistors IGBT and freewheel diodes FWD, a voltage transformer T1, a rectifying diode bank DB2, and a smoothing inductor $L_0$.

The output of the DC power supply unit DCP is controlled by a control circuit CC. More specifically, the control circuit CC applies a gate pulse to the transistors IGBT constituting the inverter INV to control the operation thereof.

The DC output thus obtained from the DC power supply unit DCP is supplied to the chamber via the vibrating current generation unit VCG and transmission cables 120A and 120B.

The vibrating current generation unit VCG, comprising a capacitor C1 and an inductance L1 for generating vibrating current, generates vibrating current by an LC resonant circuit. The electric component of the vibrating current generation unit VCG includes the coaxial transmission cables 120A and 120B extending to the chamber 101 and the target 104. More specifically, a 50Ω coaxial cable has an inductance of 0.25 pH/m and a capacitance of 100 pF/m. On the other hand, the target 104 typically has a capacitance of 300 pF or less.

It should be noted that the inductance $L_0$ of the DC power supply unit DCP is an inductance for an output filter of the power supply, and it is desirable that it has a value sufficiently (30 times or more) greater than the inductance L1 of the vibrating current generation unit VCG.

According to the configuration described above, the vibrating current generation unit VCG having an LC resonant circuit is provided at the output end of the DC power supply unit DCP, and thereby, when arc discharge occurs, its switching action can be used to generate vibrating current. When this vibrating current has crossed 0 A (zero ampere) to change its polarity, the current can be turned off by the rectifying action of arc discharge (current does not flow under the reverse voltage because thermoelectrons are emitted only from the hot spot), thereby quenching arc.

In addition, according to the invention, the sputter current is controlled so that this vibrating current has an amplitude greater than the sputter current. More specifically, the lower limit of vibrating current generated by the vibrating current generation unit VCG must fall below 0 A in order to quench arc discharge definitely by the vibrating current. To this end, the vibrating current must have an amplitude greater than the sputter current.

Thus, according to the invention, the operation of the DC power supply unit DCP is controlled so that sputtering is performed in a range where the sputter current is less than the amplitude of the vibrating current depending on the LC constants of the vibrating current generation unit VCG. Typically, this control can be performed by the control circuit CC.

In the following, the operation mechanism of the power supply according to the invention will be described in detail with reference to the voltage-current characteristics of sputtering.

Figure 2:
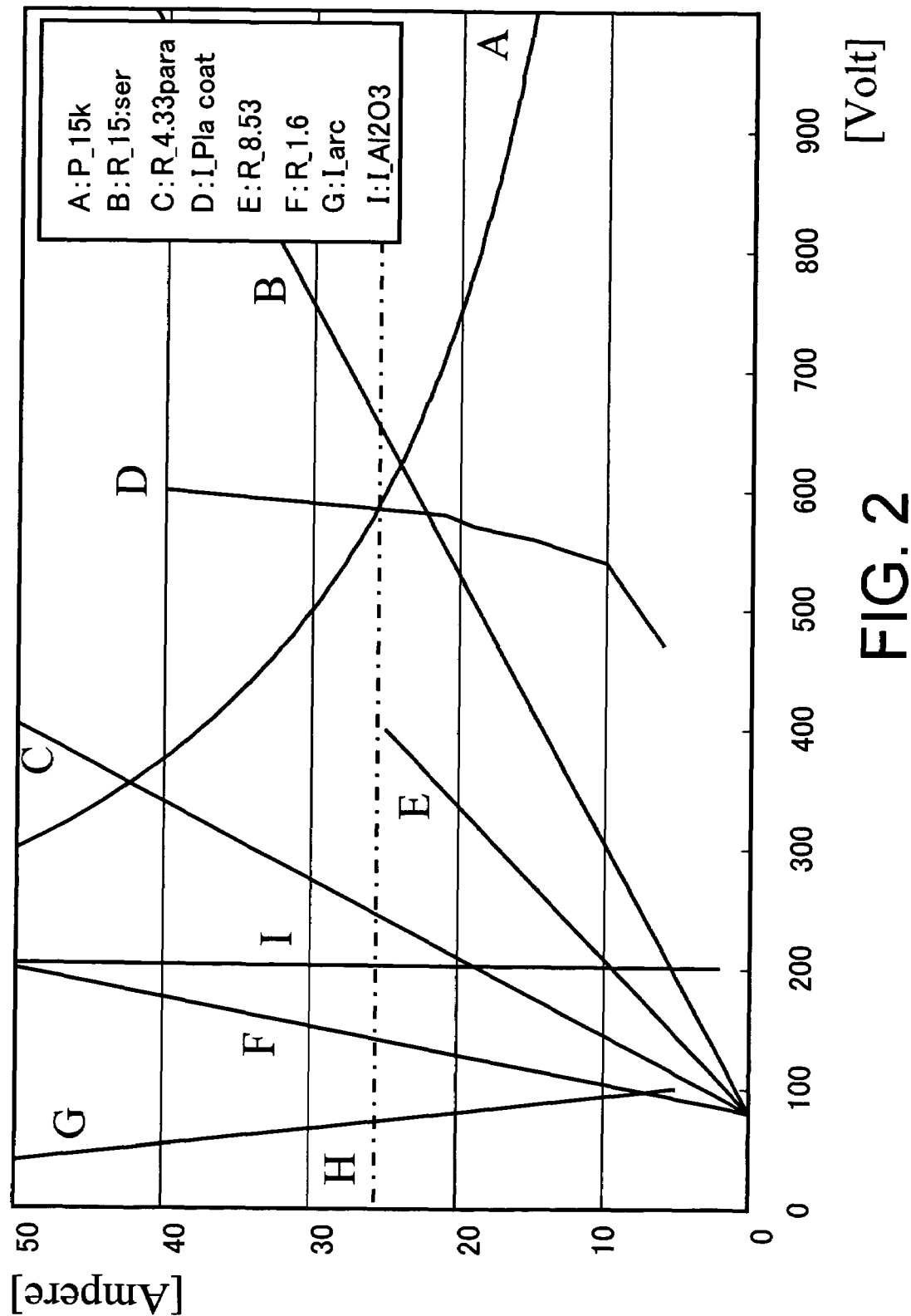
FIG. 2 is a graphical diagram showing voltage-current characteristics in DC sputtering.

FIG. 2 is a graphical diagram showing voltage-current characteristics in DC sputtering.

Here, characteristic line A in this figure is a rated power line for 15 kW (kilowatts). Characteristic lines B, C, E, and F are limit lines for sputter current, each of which is determined from the vibrating current amplitude corresponding to predetermined LC constants in the vibrating current generation unit VCG. Characteristic line D represents discharge voltage-current characteristics for conventional sputtering. Characteristic line G is a characteristic line for arc discharge. Dashed line H at 25 A represents the maximum current for 600 V×25 A=15 kW power supply. Characteristic line I that extends vertically at a voltage of 200 V represents discharge characteristics obtained when the surface of aluminum (Al) target is oxidized.

Here, for example, the characteristic line B passes below the point of a maximum power of 600 V×25 A (intersection of characteristic lines A and H). That is, the intersection of characteristic lines A and H exceeds the limit value of sputter current defined by the characteristic line B. Therefore, when LC constants corresponding to the characteristic line B are selected, the sputter current is greater than the amplitude of the vibrating current in sputtering at this intersection, that is, at a sputter current of 25 A, and hence arc is not quenched by the vibration.

In other words, if stable sputtering at maximum power is desired, the LC constants of the vibrating current generation unit VCG must be selected so that the limit line passes above that condition.

More specifically, for steep (having a large slope) characteristics such as characteristic lines C, E, and F, the generated vibrating current has an amplitude greater than the sputter current. As a result, vibrating current that definitely falls below 0 A can be obtained. However, in contrast to the current for the normal sputter characteristics represented by the characteristic line D, the condition of characteristic lines C and F results in a far greater vibrating current, which causes concern about stress on electric parts composing the target and power supply.

Thus, from a practical point of view, it is desirable to select LC constants corresponding to a characteristic line, such as characteristic line E, that passes somewhat above the maximum power condition. However, even when the characteristic line E is selected, it intersects with the discharge characteristic line I of aluminum (Al) target with oxidized surface at 10 A. As a result, any power setting that allows exceeding this current will result in continuous arc.

In this respect, conventionally, it was unavoidable to adopt the following procedure. That is, a variable power setting is used. The oxidized surface of aluminum is sputtered away in a condition of lowered power setting. As the oxidized film is reduced and the characteristic line D is gradually approached, the power setting is raised to perform normal sputtering at LC setting for characteristic line B or E.

In contrast, according to the invention, rather than adjusting the power setting, the sputter current is controlled below the limit line corresponding to the LC constants in response to the sputter voltage. This control can be performed by the control circuit CC of the power supply illustrated in FIG. 1.

Figure 3:
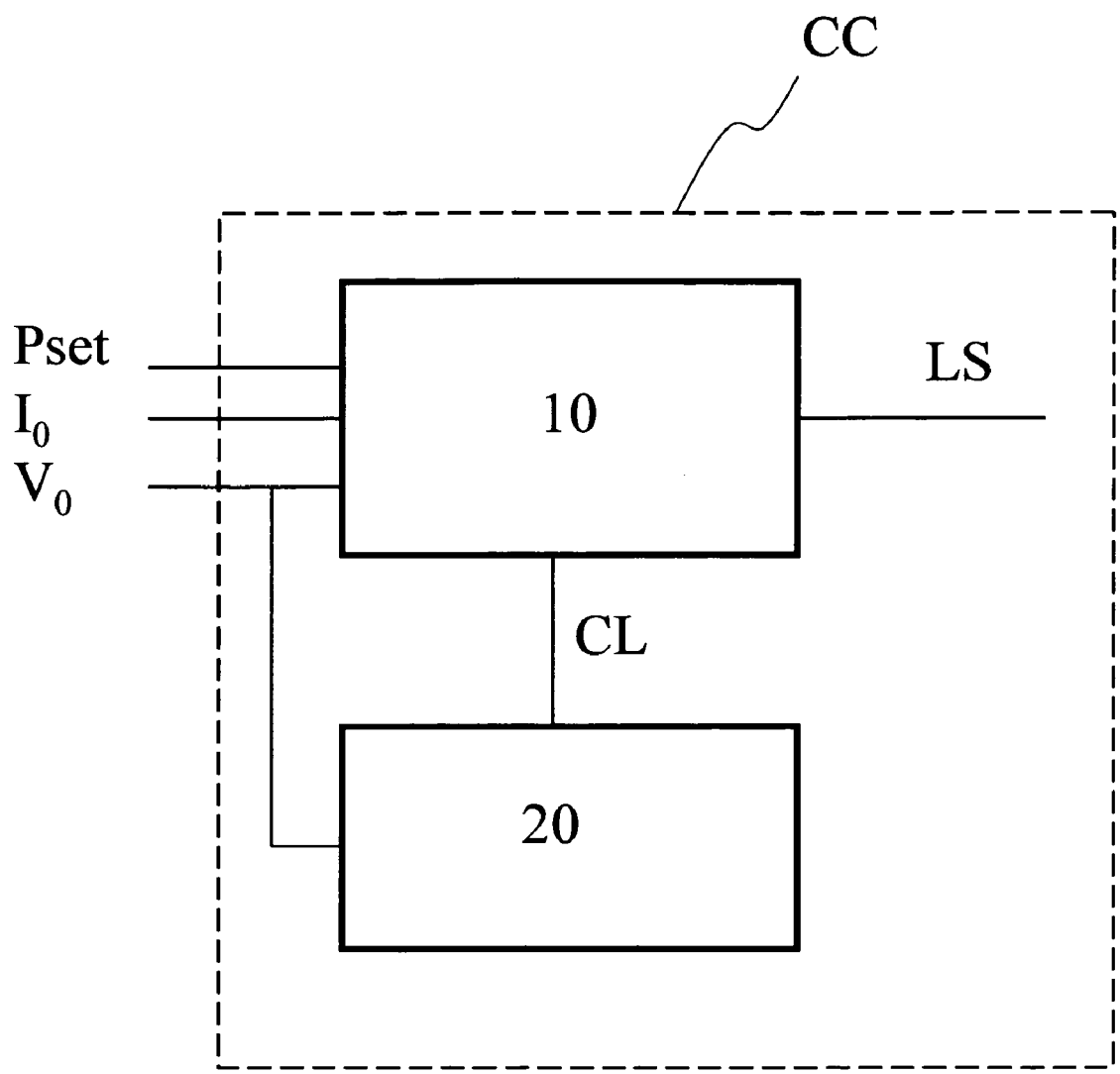
FIG. 3 is a block diagram showing a basic form of a circuit for controlling the sputter current below the limit line in the invention.

FIG. 3 is a block diagram showing a basic form of a circuit for controlling the sputter current below the limit line in the invention.

More specifically, this figure shows, in the power supply shown in FIG. 1, a part of the control circuit CC that generates a level signal, which determines a gate pulse width or frequency.

This circuit comprises a feedback control unit 10 and a limit current control unit 20.

The feedback control unit 10 separately receives as input a set value Pset of the output power, and a signal $I_0$ representing the target current and a signal $V_0$ representing the target voltage of the sputtering apparatus.

The signals $I_0$ and $V_0$ can be obtained, for example, as illustrated in FIG. 1, as voltage signals from a current detector IM and a voltage divider circuit VM in the vibrating current generation unit VCG, respectively.

The feedback control unit 10 compares the set value Pset of the output power with the signals $I_0$ and $V_0$ to feed them back and output a level signal LS for controlling the gate pulse width of the inverter INV in the DC power supply unit DCP.

The limit current control unit 20 generates a current limit signal CL in response to the target voltage based on the LC constants of the vibrating current generation unit VCG of the power supply. More specifically, as illustrated in FIG. 2, a limit characteristic line (e.g., characteristic line E) based on the LC constants is set. The signal $V_0$ representing the target voltage is used as input to calculate the current value on this limit characteristic line. A signal representing this current value is then outputted as a current limit signal CL.

The feedback control unit 10 compares the level signal LS obtained by feeding back $I_0$ and $V_0$ with the current limit signal CL. When the level signal LS is less than the current limit signal CL, the feedback control unit 10 directly outputs the level signal LS. On the other hand, when the level signal LS is greater than the current limit signal CL, the feedback control unit 10 outputs the current limit signal CL as the level signal LS.

As described above, according to the invention, in the limit current control unit 20, a limit characteristic line based on the LC constants of the vibrating current generation unit VCG is set, and a current limit is set in response to the target voltage $V_0$ so as not to exceed this limit characteristic line.

Figure 4:
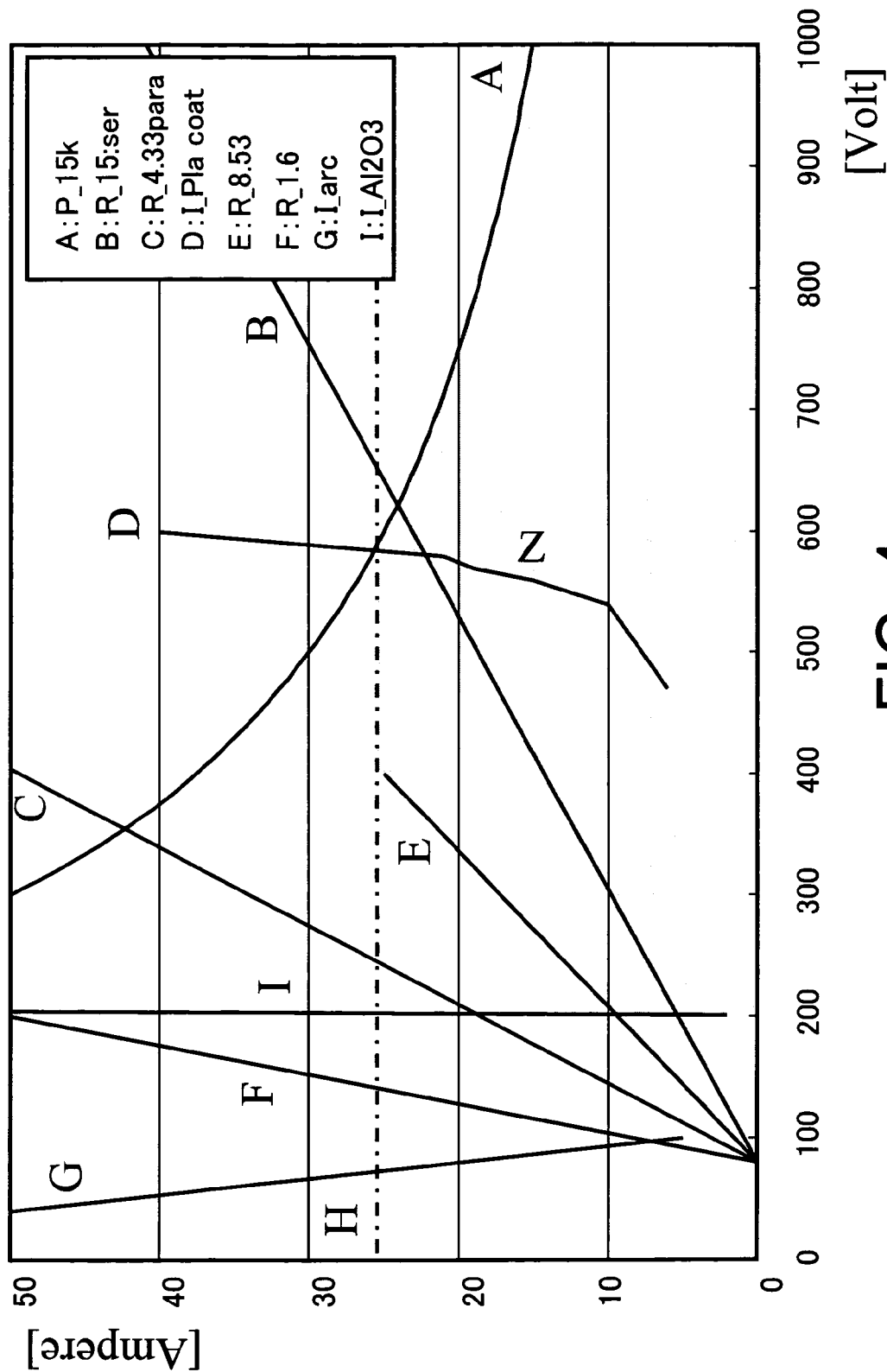
FIG. 4 is a graphical diagram illustrating the operational range of the power supply of the invention.

FIG. 4 is a graphical diagram illustrating the operational range of the power supply of the invention. More specifically, in the specific example shown in this figure, the characteristic line E in FIG. 2 is set as a limit characteristic line, and the current and/or voltage is outputted in a range Z (hatched gray in the figure) where the sputter current does not exceed the characteristic line E.

Figure 11:
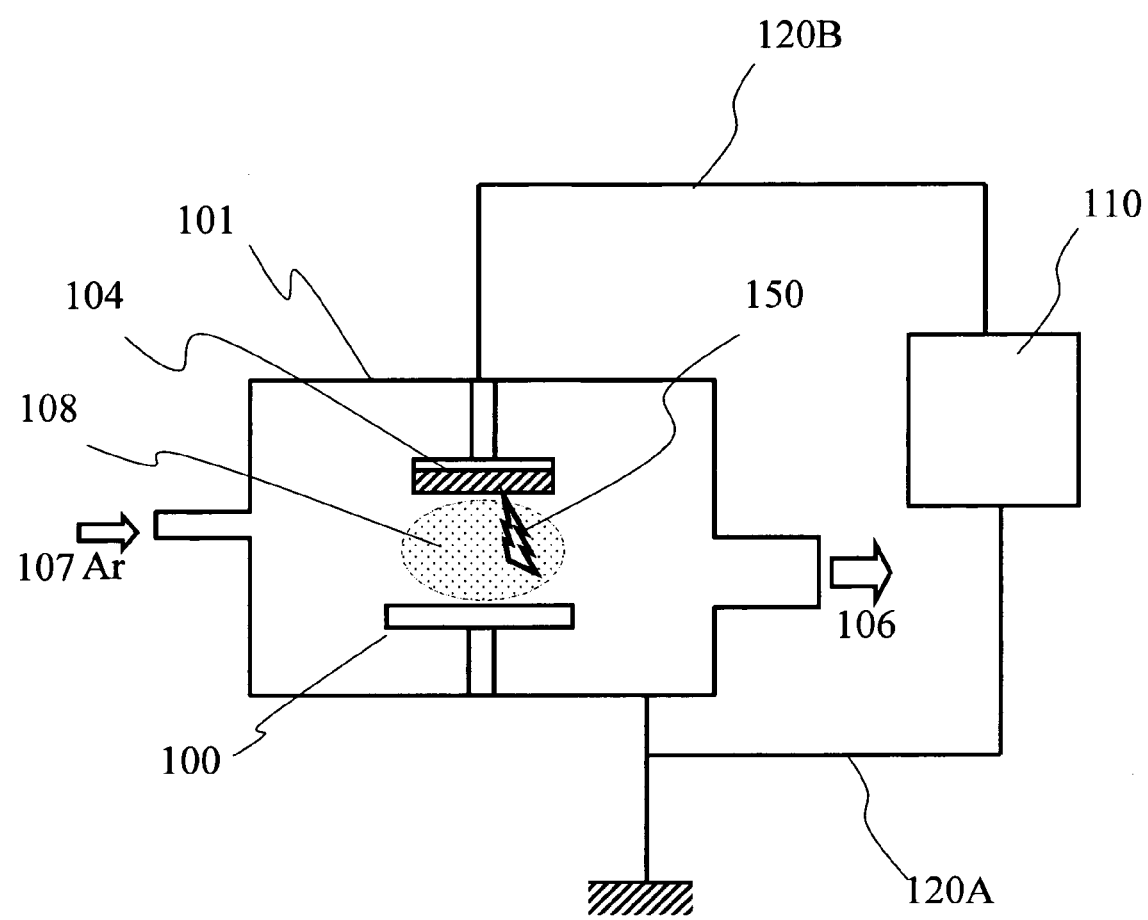
FIG. 11 is a schematic diagram showing the structure of a relevant part of a DC sputtering apparatus.

In this way, regardless of whether the sputter power is set to be high or low, sputter current exceeding the limit characteristic line can be prevented from flowing. As a result, even if arc discharge occurs, the amplitude of the vibrating current can be kept always larger than the sputter current. Thus the vibrating current definitely falls below zero ampere, and thereby arc can be definitely quenched. Consequently, this power supply can be used for a sputter apparatus as illustrated in FIG. 11 to quickly quench any arc discharge that may occur and to perform stable sputtering from high sputter power to low sputter power.

Next, a further detailed specific example of the invention will be described.

Figure 5:
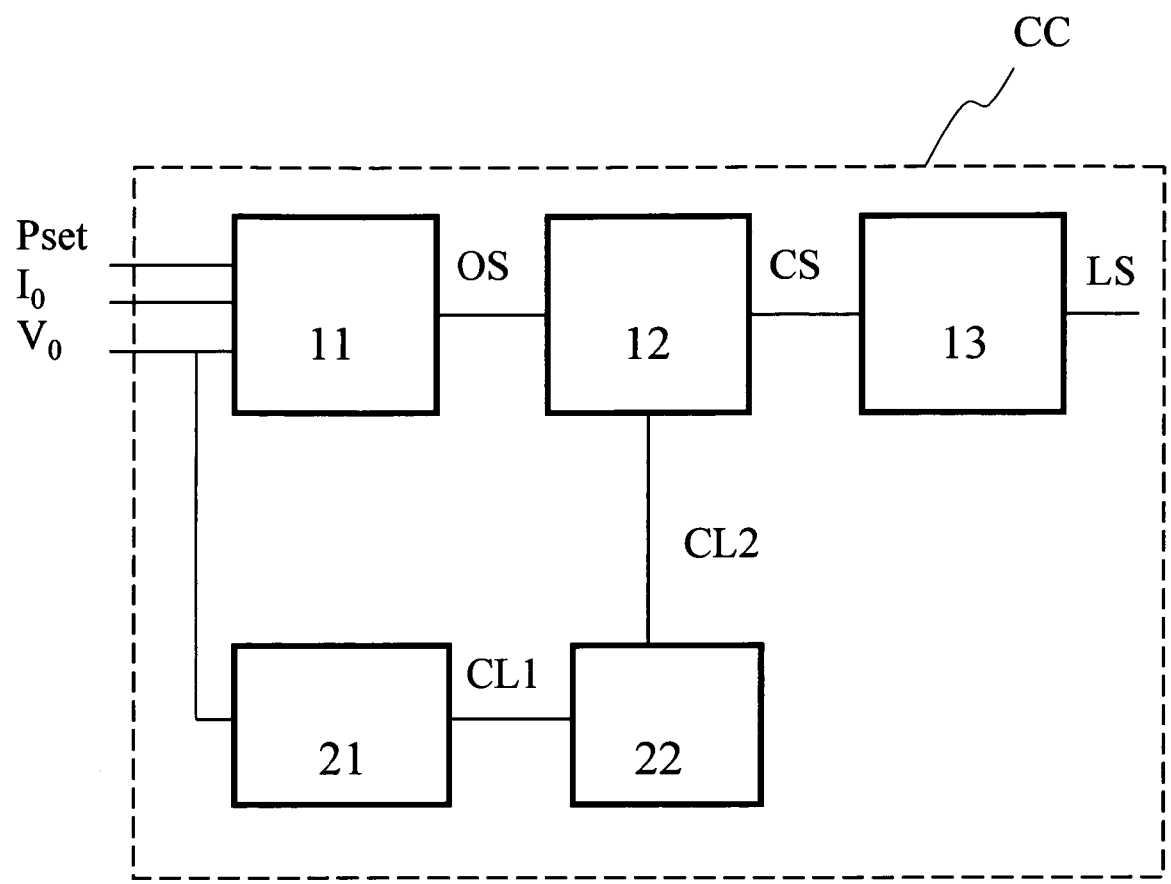
FIG. 5 is a block diagram showing an example of the circuit for controlling the sputter current below the limit characteristic line in the invention.

FIG. 5 is a block diagram showing an example of the circuit for controlling the sputter current below the limit characteristic line in the invention. That is, this figure also shows, in the power supply shown in FIG. 1, a part of the control circuit CC that generates a level signal, which determines a gate pulse width or frequency.

This circuit comprises an output power calculation unit 11, a power control unit 12, a current control unit 13, a maximum current signal generation unit 21, and an offset generation unit 22. Among them, the output power calculation unit 11, . . . , the current control unit 13 correspond to the feedback control unit 10 in the block diagram of FIG. 3. The maximum current signal generation unit 21 and the offset generation unit 22 correspond to the limit current control unit 20 in the block diagram of FIG. 3.

The output power calculation unit 11 separately receives as input a signal $I_0$ representing the target current and a signal $V_0$ representing the target voltage of the sputtering apparatus. The output power calculation unit 11 calculates the power outputted from the power supply based on these signals $I_0$ and $V_0$, and outputs an output power signal OS corresponding thereto.

The power control unit 12 performs power feedback control. More specifically, the power control unit 12 compares the output power signal OS outputted from the output power calculation unit 11 with a set value Pset of the output power, and calculates a current set value corresponding to the difference. Then, as described later in detail, the power control unit 12 compares it with a current limit signal CL2 to output a current set signal CS.

The current control unit 13 performs current feedback control. More specifically, the current control unit 13 compares the current set signal CS with the signal $I_0$ to output a level signal LS for controlling the gate pulse width of the inverter INV in the DC power supply unit DCP.

By the blocks described above, feedback control for the DC power supply unit DCP is performed using $I_0$ and $V_0$ as feedback signals for the current set signal Pset.

In addition, according to the invention, the maximum current signal generation unit 21 generates a current limit signal CL in response to the target voltage based on the LC constants of the vibrating current generation unit VCG. More specifically, as illustrated in FIG. 2, a limit characteristic line (e.g., characteristic line E) based on the LC constants is set. The signal $V_0$ representing the target voltage is used as input to calculate the current value on this limit characteristic line. A signal representing this current value is then outputted as a current limit signal CL1.

The current limit signal CL1 is outputted to the offset generation unit 22, and then outputted to the power control unit 12 as a current limit signal CL2 to which an offset has been imparted so that, for example, the current setting is greater than zero ampere even when the output voltage is zero volt.

The power control unit 12 compares the output power signal OS outputted from the output power calculation unit 11 with the set value Pset of the output power, and calculates a current set value corresponding to the difference. In addition, the power control unit 12 compares this current set value with the current limit signal CL2.

When the current set value is less than the current limit signal CL2, that is, the value of sputter current to be passed is less than the limit characteristic line (e.g., characteristic line E in FIG. 2) determined by the LC constants, the power control unit 12 directly outputs the current set value as a current set signal CS.

On the other hand, when the current set value is greater than the current limit signal CL2, that is, the value of sputter current to be passed is greater than the limit characteristic line (e.g., characteristic line E in FIG. 2) determined by the LC constants, the power control unit 12 outputs the current limit signal CL2 instead of the current set value as a current set signal CS.

As described above, according to the invention, the maximum current signal generation unit 21 sets a limit characteristic line based on the LC constants of the vibrating current generation unit VCG, and sets a current limit in response to the target voltage $V_0$. That is, as illustrated in FIG. 4, the power supply is operated in a range where the sputter current does not exceed a predetermined limit characteristic line.

In this way, regardless of whether the sputter power is set to be high or low, sputter current exceeding the limit characteristic line can be prevented from flowing. As a result, even if arc discharge occurs, the amplitude of the vibrating current can be kept always larger than the sputter current. Thus the vibrating current definitely falls below zero ampere, and thereby arc can be definitely quenched.

Furthermore, appropriate LC constants can be selected depending on the configuration of the power supply, structure of the sputtering apparatus, sputtered material, and condition, and thereby arc can be definitely quenched without producing excessively large vibrating current. In addition, there is no concern about stress imposed on the target, electric parts, and the like.

Here, below the arc voltage, the offset generation unit 22 provides an offset to the current set value to fix the setting of the current set value, for example, at about five percent of the rating, and thereby the initial output voltage can be produced.

After investigation, the inventor has found that an appropriate amplitude of the vibrating current is about 1.3 to 2 times as large as the normal sputter current. Therefore, the LC constants of the vibrating current generation unit VCG may be determined depending on the structure and application of the sputtering apparatus so that such a range of vibrating current is obtained. The calculation processing in the maximum current signal generation unit 21 may be performed on the basis of the limit characteristic line corresponding to these LC constants.

More specifically, the desirable range is such that the following equation is satisfied:

$$I=(V-Va)\times(C/L)^{1/2}/K$$

where I is the current outputted from the power supply, V is the voltage outputted from the power supply, L is the inductance of the vibrating current generation unit VCG, C is the capacitance of the vibrating current generation unit VCG, Va is the arc voltage, and K is a multiplicative factor of amplitude.

In the above equation, (V−Va) is the difference between the sputter voltage and the arc voltage. The amplitude of the vibrating current generated by the vibrating current generation unit VCG is given by the voltage multiplied by the conductance $(C/L)^{1/2}$ of the vibrating circuit. However, since the vibration is attenuated, it cannot cross 0 A unless it is K times as large as the sputter current.

That is, if the current outputted from the power supply is limited in a range that does not exceed the current I defined by the above equation, the vibrating current definitely falls below zero ampere, and thereby arc can be definitely quenched, when arc discharge occurs.

Figure 6:
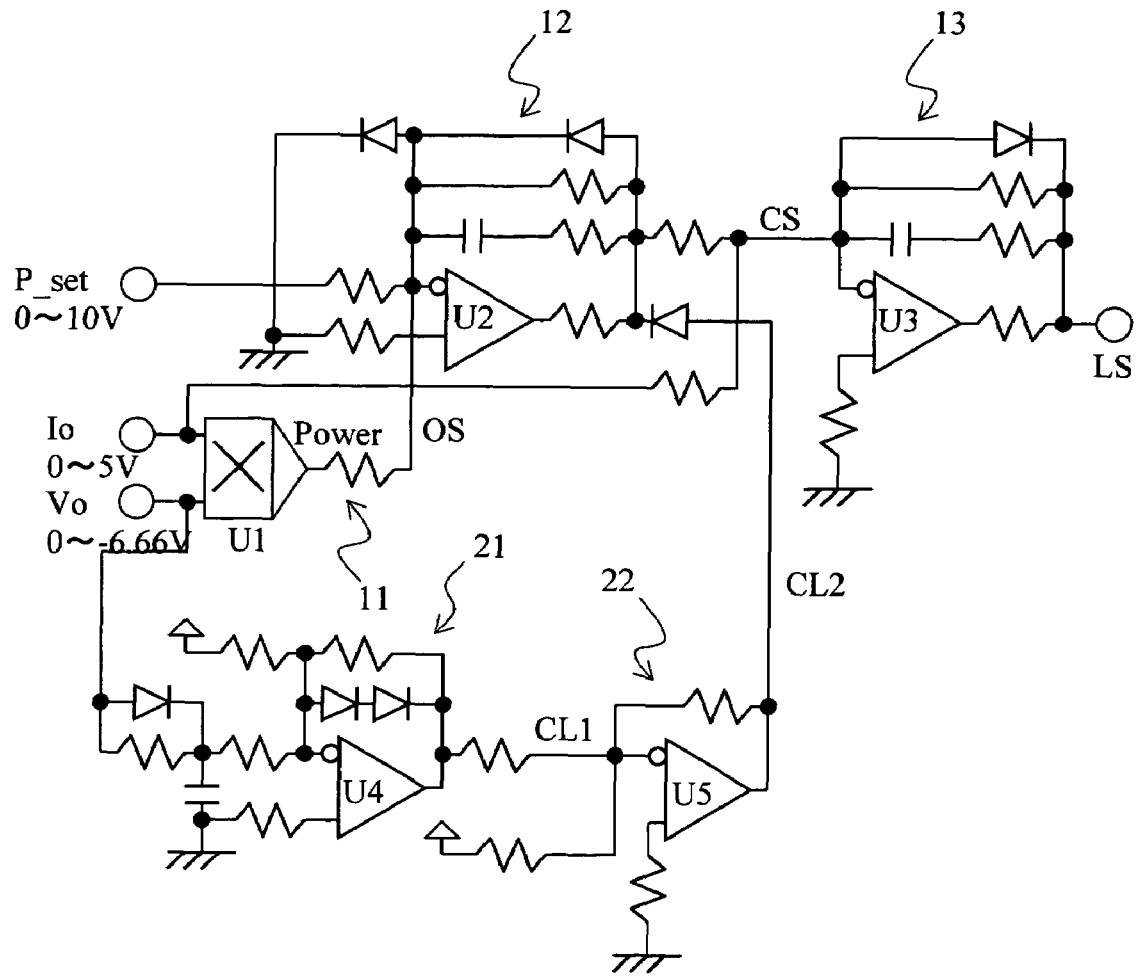
FIG. 6 is a schematic diagram showing an example of the circuit embodying the block diagram shown in FIG. 5.

FIG. 6 is a schematic diagram showing an example of the circuit embodying the block diagram shown in FIG. 5. In this figure, elements similar to those described above with reference to FIGS. 1 to 5 are marked with the same numerals and are not described in detail.

In the circuit of this specific example, the signal $I_0$ representing the sputter current and the signal $V_0$ representing the sputter voltage are given as voltage signals of 0 to 5 volts and 0 to −6.66 volts, respectively. The signal Pset representing the power set value is given as a voltage signal of 0 to 10 volts.

The signals $I_0$ and $V_0$ are inputted to a multiplier U1 and multiplied to calculate the output power OS.

The output signal OS is inputted to an error amplifier U2 for power feedback control, where it is compared with the power set signal Pset to output a current set signal.

An error amplifier U3 for current feedback control compares the current set value calculated by the error amplifier U2 with $I_0$ to generate a level signal that determines a gate pulse width (or frequency) of the inverter INV. If the constants are set so that the maximum output of the error amplifier U2 is the maximum current, limitation can be performed by the maximum current value (e.g., characteristic line H in FIG. 2).

Furthermore, a calculator U4 generates a current limit signal CL1 in proportion to the sputter voltage $V_0$ based on a limit characteristic line predetermined by the LC constants.

A calculator U5 then generates a current limit signal CL2 provided with a small offset so that the current setting is above 0 A even when the output voltage is 0 V.

According to such a specific example, a power supply that operates in the region below the limit characteristic line as shown in FIG. 4 can be realized.

Figure 7:
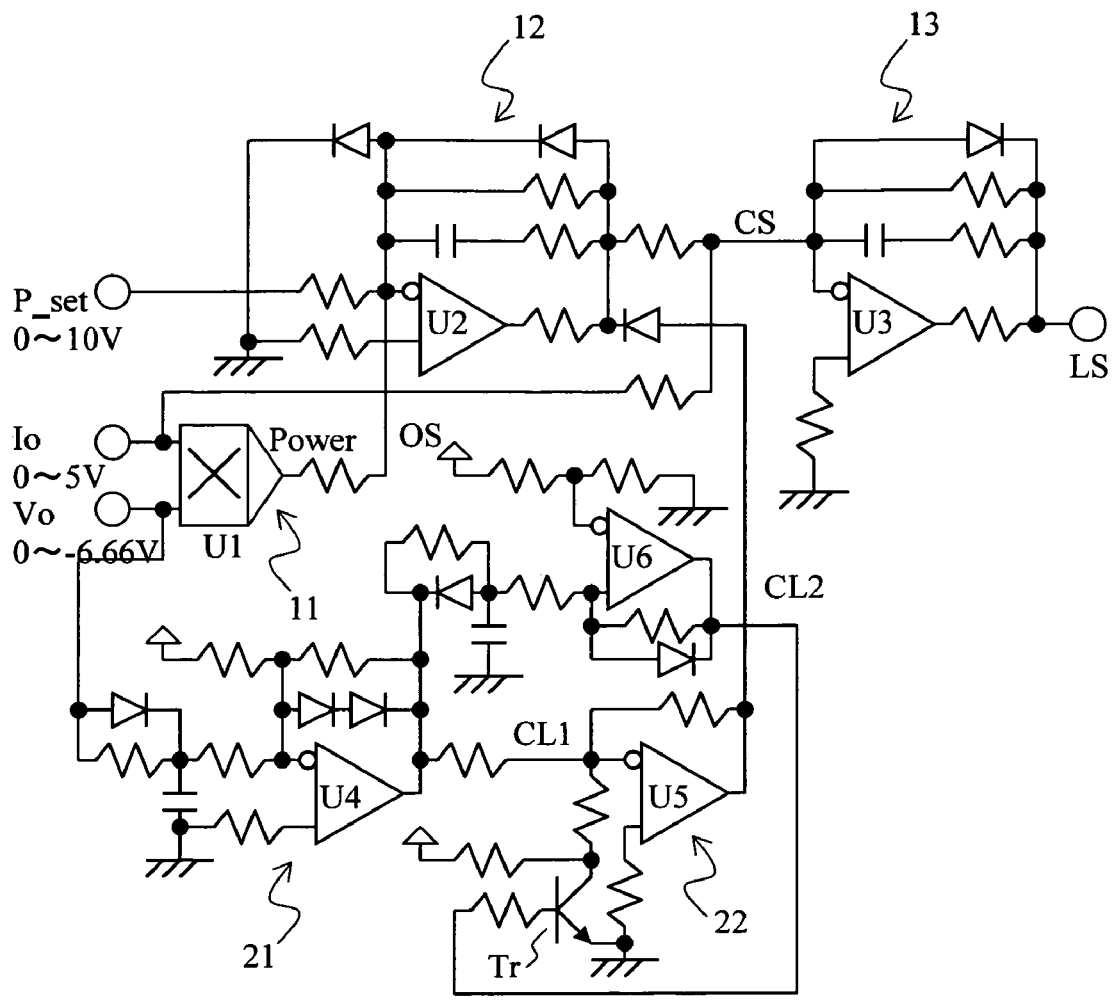
FIG. 7 is a schematic diagram showing a variation of a relevant part of the discharging power supply of the invention.

FIG. 7 is a schematic diagram showing a variation of a relevant part of the discharging power supply of the invention. In this figure, elements similar to those described above with reference to FIGS. 1 to 6 are marked with the same numerals and are not described in detail.

The power supply of the invention performs its basic operation by using the circuit of FIG. 6 described above. However, for example, when the output voltage is 80 V or less, the current setting does not become 0 A in relation to the offset.

Thus in this variation, as shown in FIG. 7, a comparator U6 is added. The comparator U6, which is a comparator having hysteresis, turns on a transistor Tr to clear the offset provided by the calculator U5 when the output voltage exceeds a first default voltage, for example, 200 V. On the other hand, the comparator U6 turns off the transistor Tr at a predetermined timing using a CR timer to provide the offset when the output voltage reaches a second default voltage, for example, 10 V or less.

Below the arc voltage, the initial output voltage can be produced by fixing the setting of the current set value at about five percent of the rating. However, once an output voltage of, for example, 200 volts or more is produced, this offset can be cleared. Thus the current setting can be zeroed, and thereby the vibrating current can definitely fall below zero when arc discharge occurs.

Figure 8:
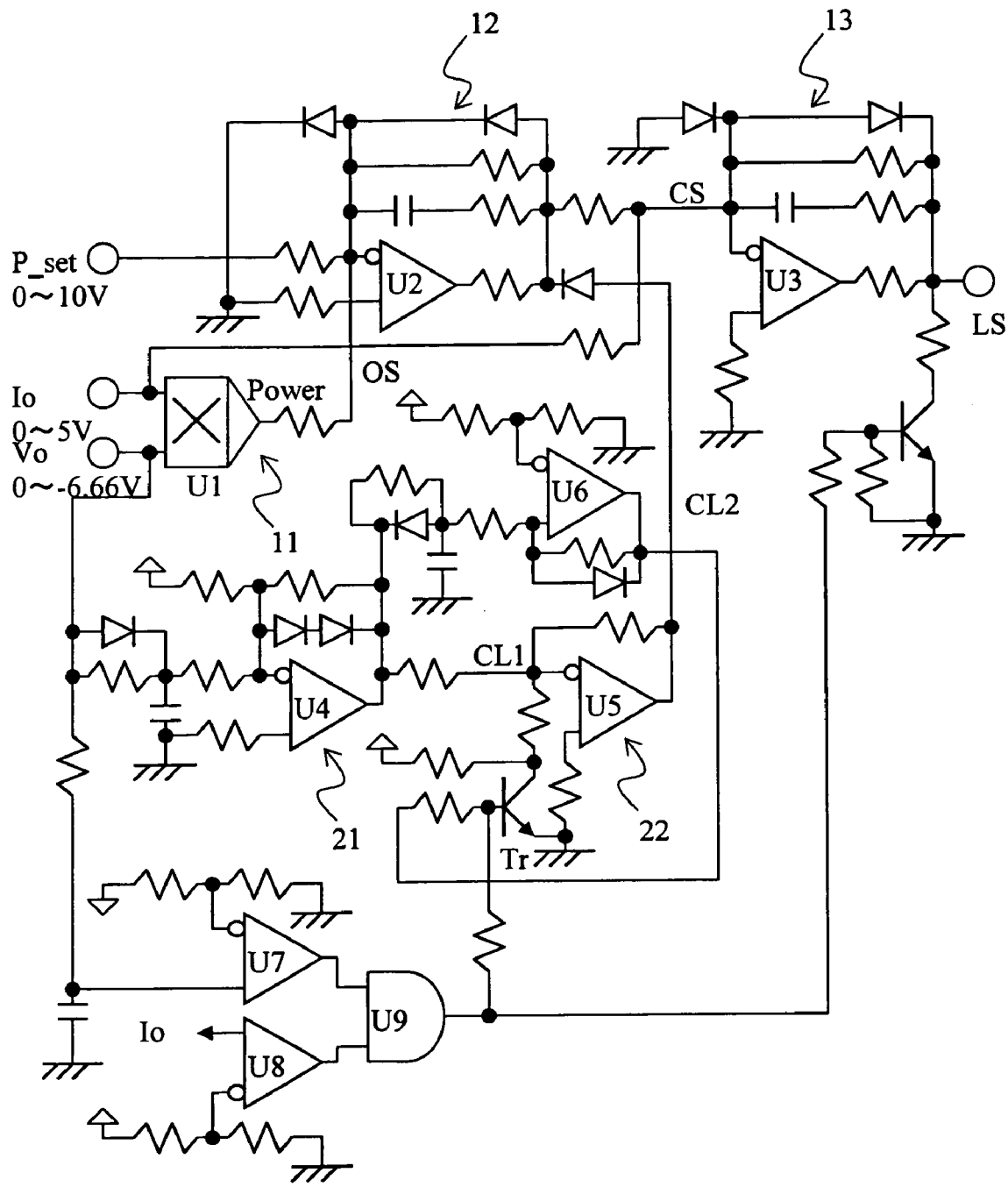
FIG. 8 is a schematic diagram showing another variation of a relevant part of the discharging power supply of the invention.

FIG. 8 is a schematic diagram showing another variation of a relevant part of the discharging power supply of the invention. Also in this figure, elements similar to those described with reference to FIGS. 1 to 7 are marked with the same numerals and are not described in detail.

In this variation, a function has been added for detecting arc discharge to immediately terminate the gate pulse. Specifically, calculators U7, U8, and U9 are added. The calculator U7 determines the output voltage. The calculator U8 determines the output current. The calculator U9 takes their logical multiplication (AND) to determine arc, thereby producing a signal for terminating the output.

The calculator U7 compares the signal $V_0$ with a default voltage to output a logic. The default voltage in this case can be set to, for example, about 150 volts. That is, if the sputter voltage falls below this default value, it is determined that there is a possibility of arc discharge.

Similarly, the calculator U8 compares the signal $I_0$ with a signal corresponding to a default current value. Here, a desirable default current value is about ⅕ to ⅒ of the rated output current.

The logical multiplication of the calculators U7 and U8 is taken to determine the occurrence of arc discharge when the sputter voltage is lower than its default value and the sputter current is greater than its default value. On the basis of this determination, the gate pulse is immediately terminated.

In addition, a low-pass filter C7 is provided for the voltage signal determined by the calculator U7 so that it does not operate on arc that is quenched in one vibration. The number of vibrations (duration) of arc discharge before a gate pulse is blocked can be adjusted by appropriately determining the constants of the low-pass filter C7.

Furthermore, after arc is quenched, the circuit of this variation can recover the output in a short time, and operate in a minimum extra latency.

In other words, determination of continuous arc is added. Upon determination of continuous arc, switching of power control is immediately terminated, and the offset for current limit value is canceled. Consequently, when continuous arc occurs, the energy entering the continuous arc can be reduced by decreasing arc current and duration, and the resting time can be controlled to the minimum necessary.

Example

A specific example of quenching arc discharge according to the invention will now be described with reference to an Example.

Figure 9:
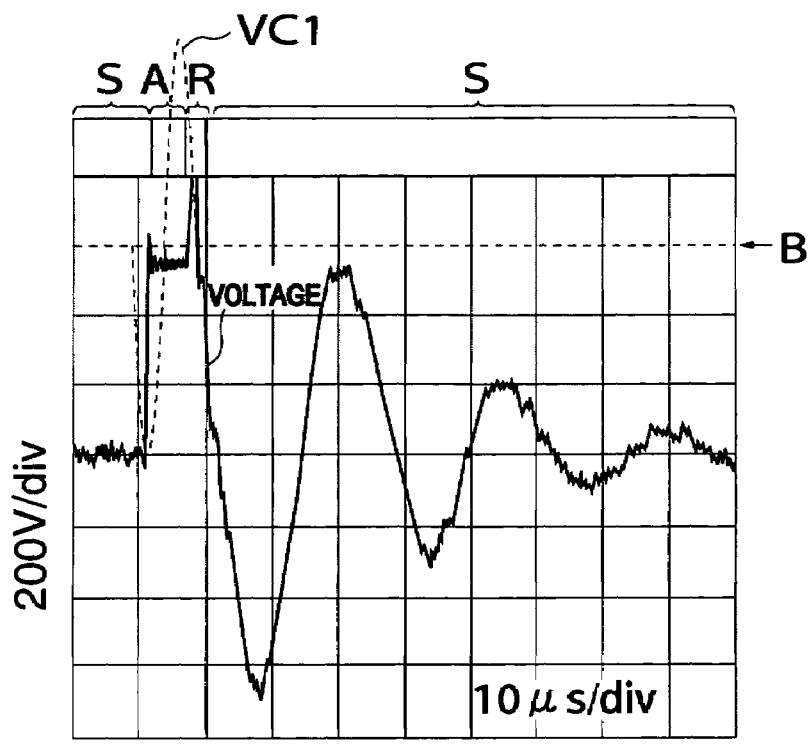
FIG. 9 is a graphical diagram illustrating the operation of the discharging power supply of the invention.
Figure 10:
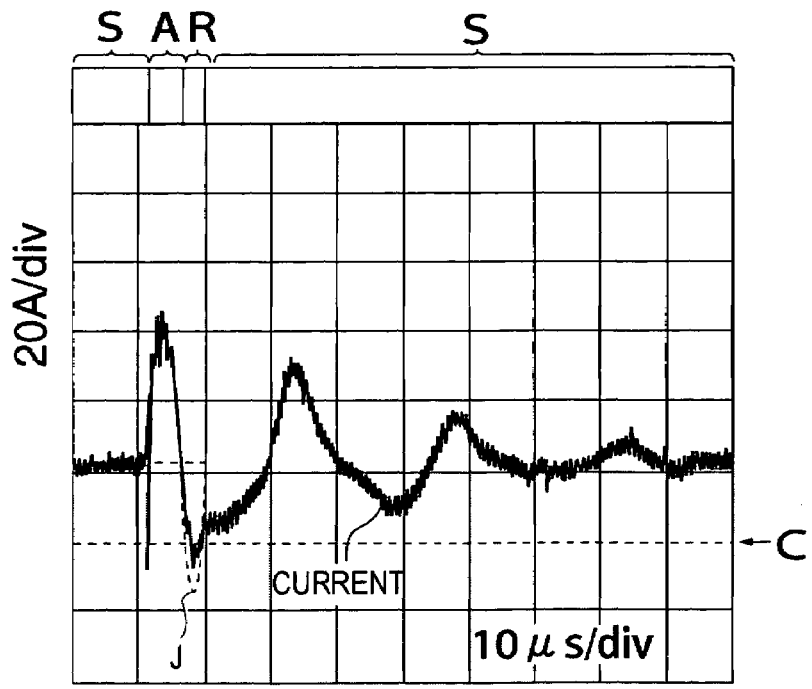
FIG. 10 is a graphical diagram illustrating the operation of the discharging power supply of the invention.

FIGS. 9 and 10 are a graphical diagram illustrating the operation of the discharging power supply of the invention. That is, these figures show waveforms in which vibrating current is generated by the vibrating current generation unit VCG and arc discharge, and then arc is quenched.

Here, in FIGS. 9 and 10, the horizontal axis represents time, which is classified into sputter state S, arc discharge state A, and resting state R. The waveform of FIG. 9 represents the voltage of the target 104, and the waveform of FIG. 10 represents the current of the target 104. Here, since the target voltage is measured at the target 104 relative to the chamber 101, the target voltage appears on the negative side relative to the position of symbol B (zero volt). The target current is represented on the positive side relative to the position of symbol C (zero ampere).

The voltage scale is set to 200 V/div, the current scale is set to 20 A/div, and the time scale is set to 10 μs/div.

FIGS. 9 and 10 are now described along the time axis. The initial state is a stable sputtering state (S) at 600 V and 22 A. Subsequently, the point at which the discharge voltage abruptly decreases to nearly 80 V represents arc generation (A). At this time, capacitor C1 has already been charged at a sputter voltage of 600 V, and the target voltage has decreased to 80 V. The voltage difference (600-80)=520 V is then applied across the inductance L of (L1)+(coaxial cables 120A and 120B), which gives 520 V=L×di/dt, and thereby the target current rapidly increases. At the same time, the voltage of the capacitor C1 decreases for supplying this target current.

The vibrating current is maximized when the charge of the capacitor C1 reaches zero, with its value satisfying the equation of energy conservation $CV^2=LI^2$ (note that ½ on both sides of the equation is omitted). That is, calculation in view of an arc discharge voltage of 80 V leads to the following relation:

$$C1 \times (V_{sp}-V_{arc})^2 = (L1+L_{cable}) \times Ip^2 \qquad (1)$$

where $V_{sp}$ denotes the sputter voltage, $V_{arc}$ the arc discharge voltage, $L_{cable}$ the inductance of cables 120A and 120B, and Ip the vibrating current, respectively. This equation can be rewritten to obtain the following:

$$(V_{sp}-V_{arc})/Ip = ((L1+L_{cable})/C1)^{1/2} \qquad (2)$$

That is, the vibrating current Ip is determined by $(L/C)^{1/2}$ and the immediately preceding sputter voltage. Since the cycle of vibration T is given by $T=2\pi(LC)^{1/2}$, the inductance L and the capacitance C can be calculated back from the cycle T, voltage change dV, and vibrating current Ip.

$$dV/Ip = (L/C)^{1/2} \qquad (3)$$

$$T = 2\pi(LC)^{1/2} \qquad (4)$$

Multiplying eqs. (3) and (4) on each side yields the following:

$$T \times dV/Ip = (L/C)^{1/2} \times 2\pi(LC)^{1/2} \qquad (5)$$
$$= 2\pi L$$

On the other hand, dividing each side of eq. (4) by each side of eq. (3) yields the following:

$$T/(dV/Ip) = 2\pi (LC)^{1/2}/(L/C)^{1/2} \quad (6)$$
$$= 2\pi C$$

From eq. (5), L is determined as follows:

$$L = T \times dV/Ip/2\pi$$
$$= 520\,(V)/38(A) \times 10E-6(s)/2\pi$$
$$= 2.18E-5H$$
$$= 21.8\,\mu H$$

From eq. (6), C is determined as follows:

$$C = T/2\pi/(dV/Ip)$$
$$= 10E-6\,(s)/2\pi/(520\,(V)/38\,(A))$$
$$= 1.16E-7\,F$$
$$= 0.116\,\mu F$$

These values are close to the actual circuit constants (L=(20+2.5) μH, C=0.102 μF). Here, the capacitor component of the cables 120A and 120B and the target 104 is, even assuming the length of the cables 120A and 120B to be 10 m, on the order of 100 pF/m×10 m+300 pF=1300 pF=0.0013 μF. This accounts for about 1/100 of the capacitance of the capacitor C1, and is thus negligible.

In FIG. 9, the dashed line VC1 represents voltage variation of the capacitor C1 after the arc start time. In FIG. 10, the sine wave indicated by dashed line J is the arc vibrating current. The center of this vibrating current is the sputter current.

When the vibrating current J increases toward its peak, the voltage VC1 of the capacitor C1 falls below 0 volt. When the vibrating current J has passed its peak and decreases again to fall below the level of sputter current Isp, the voltage VC1 of the capacitor C1 increases to the maximum reverse voltage.

After the vibrating current falls below 0 A (exactly, the voltage level at which arc discharge is maintained), arc current does not flow (i.e., current through the inductance L1 becomes 0 A) because of the rectifying action of arc discharge. As a result, the voltage VC1 becomes equal to the target voltage. The capacitor C1 is charged by the sputter current Isp that the inductance $L_0$ has kept at a constant current, and after its voltage exceeds 200 V, the sputter discharge current begins to increase.

Arc discharge is quenched here presumably because hot spots are cooled and cease to emit thermoelectrons, since arc is not supplied with energy during the period after the vibrating current crosses 0 A until the arc maintaining voltage is exceeded. From the waveforms illustrated in FIGS. 9 and 10, this period can be read as nearly 3 μs. However, various parameters must be taken into consideration in determining whether arc can be quenched no matter how short this period may be.

The parameters determining the arc quenching period may include the following, for example:

(1) Material properties of the target (work function, thermal conductivity, surface oxidation: work function of the surface, surface temperature, etc.)

(2) Sputter power (voltage, current)

(3) Peak current and vibration cycle of the vibrating current (LC value)

(4) Sputter atmosphere (argon pressure, residual gas partial pressure, kind of additive gas, etc.)

In FIGS. 9 and 10, sputter discharge is ceased for a period of about 10 microseconds after arc generation until the voltage exceeds 200 V again. When arc is quenched and sputtering is resumed, the current does not immediately return to the sputter current Isp, and thus the voltage jumps to about −1300 V. The sputter current, lagging behind this increase of voltage, increases up to about 50 A, and then settles to damped vibration. The reason that the sputter current does not immediately recover even when arc discharge is quenched may include dilution of plasma due to the 10-microsecond rest and current suppression effect due to the inductance L1.

The embodiments of the invention have been described with reference to specific examples. However, the invention is not limited to these specific examples.

For example, the configuration, structure, number, layout, shape, material and the like in the DC power supply unit, vibrating current generation unit, control circuit, and other parts of the sputtering apparatus of the invention are not limited to the specific examples described above, and any one appropriately selected by those skilled in the art is encompassed within the scope of the invention, as long as it covers the feature of the invention.

More specifically, for example, any specific configuration of each circuit, and the number and layout relationship for the circuit components including diodes, resistors, and transistors provided in the sputtering power supply, which are appropriately modified by those skilled in the art, are encompassed within the scope of the invention.

In addition, the discharging power supply of the invention can also be applied to various applications as well as sputtering that require generation of discharge through application of DC voltage, to achieve similar functions and effects.

Any other discharging power supplies, sputtering power supplies, and sputtering apparatuses that comprise the elements of the invention and can be modified by those skilled in the art are encompassed within the scope of the invention.

INDUSTRIAL APPLICABILITY

As described above, according to the invention, a limit characteristic line based on the LC constants of the vibrating current generation unit is set, and the power supply is operated in a range where the sputter current does not exceed this limit characteristic line. In this way, regardless of whether the sputter power is set to be high or low, sputter current exceeding the limit characteristic line can be prevented from flowing. Even if arc discharge occurs, the amplitude of the vibrating current can be kept always larger than the sputter current. Thus the vibrating current definitely falls below zero ampere, and thereby arc can be definitely quenched.

As a result, for example, the operation requires no switching and thus the cleaning time can be reduced when the target is dirty or oxidized, which conventionally requires switching to the cleaning mode for sputtering.

In addition, the frequency of occurrence of continuous arc dramatically decreases even when the discharge voltage decreases because of target wear. Consequently, stable sputtering can be performed.

Furthermore, the frequency of occurrence of continuous arc can be positively decreased even when the sputter voltage decreases for a short time because of load variation. Consequently, stable sputtering can be performed.

Furthermore, when continuous arc unfortunately occurs, the energy entering the continuous arc can be minimized, and the resting time can be at the minimum necessary. Consequently, damage to the process and errors in sputter power can be reduced.

That is, the invention can provide a discharging power supply, sputtering power supply, and sputtering apparatus being capable of quickly and definitely break arc discharge with a simple configuration, thus providing significant industrial advantages.

The invention claimed is:

1. A discharging power supply, comprising:
a direct current power supply unit;
a control unit configured to control an output of the direct current power supply unit; and
a vibrating current generation unit having a capacitance connected in parallel with a pair of outputs from the direct current power supply unit and an inductance connected to at least one of the pair of outputs, wherein
the discharging power supply outputs discharging power via the vibrating current generation unit,
the control unit is configured to control the direct current power supply unit so that current outputted from the direct current power supply unit does not exceed a limit current value in at least a portion of a range of voltage that can be outputted from the direct current power supply unit, the portion of the range excluding zero voltage,
the limit current value has a positive correlation with the absolute value of the voltage in the at least a portion of the range of voltage, and
the limit current value corresponds to an upper limit current satisfying the equation:

$$I=(V-Va)\times(C/L)^{1/2}/K,$$

where I is current outputted from the direct current power supply unit, V is voltage outputted from the direct current power supply unit, L is the inductance, C is the capacitance, Va is arc voltage, and K is a multiplicative factor of amplitude.

2. The discharging power supply as claimed in claim 1, wherein the inductance also includes inductance of a connecting cable extending to a supply recipient that is supplied with the discharging power.

3. The discharging power supply as claimed in claim 1, further comprising:
voltage detection means for detecting voltage outputted via the vibrating current generation unit; and
current detection means for detecting current outputted via the vibrating current generation unit, wherein
the control unit performs feedback control based on a detection result by the voltage detection means and a detection result by the current detection means.

4. The discharging power supply as claimed in claim 1, further comprising:
voltage detection means for detecting voltage outputted via the vibrating current generation unit; and
current detection means for detecting current outputted via the vibrating current generation unit, wherein
the control unit is configured to:
determine a set value of output current based on a detection result by the voltage detection means, a detection result by the current detection means, and a set value of output power,
calculate the limit current value at the voltage in response to the detection result by the voltage detection means,
control the direct current power supply unit based on the set value of the output current when the set value of the output current is less than the limit current value, and
control the direct current power supply unit so that the limit current value is outputted when the set value of the output current is greater than the limit current value.

5. The discharging power supply as claimed in claim 4, wherein the control unit is configured to:
use the limit current value to which an offset is not added when the detection result by the voltage detection means is higher than a first predetermined voltage, and
use the limit current value to which an offset is added when the detection result by the voltage detection means is lower than a second predetermined voltage.

6. The discharging power supply as claimed in claim 3, wherein the control unit sets the output of the direct current power supply unit to zero when the detection result by the voltage detection means is lower than a third predetermined voltage and the detection result by the current detection means is higher than a first predetermined current.

7. The discharging power supply as claimed in claim 3, wherein the detection result by the voltage detection means is determined via a low-pass filter.

* * * * *